United States Patent
Yeh et al.

(10) Patent No.: US 7,057,938 B2
(45) Date of Patent: *Jun. 6, 2006

(54) NONVOLATILE MEMORY CELL AND OPERATING METHOD

(75) Inventors: Chih Chieh Yeh, Hsinchu (TW); Hung Yueh Chen, Hsinchu (TW); Yi Ying Liao, Hsinchu (TW); Wen Jer Tsai, Hsinchu (TW); Tao Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 153 days.

This patent is subject to a terminal disclaimer.

(21) Appl. No.: 10/756,777

(22) Filed: Jan. 14, 2004

(65) Prior Publication Data

US 2004/0145950 A1     Jul. 29, 2004

Related U.S. Application Data

(63) Continuation-in-part of application No. 10/113,356, filed on Mar. 29, 2002, now Pat. No. 6,690,601.

(51) Int. Cl.
  *G11C 16/00* (2006.01)
(52) U.S. Cl. ............... 365/185.28; 365/185.29
(58) Field of Classification Search ............ None
  See application file for complete search history.

(56) References Cited

U.S. PATENT DOCUMENTS

| | | | | |
|---|---|---|---|---|
| 4,004,159 A | * | 1/1977 | Rai et al. | 365/185.28 |
| 5,163,022 A |   | 11/1992 | Homma et al. | 365/196 |
| 5,396,459 A | * | 3/1995 | Arakawa | 365/185.29 |
| 5,659,503 A | * | 8/1997 | Sudo et al. | 365/185.2 |
| 5,768,192 A |   | 6/1998 | Eitan | 365/185.24 |

(Continued)

FOREIGN PATENT DOCUMENTS

EP     1378944 A1     1/2004

OTHER PUBLICATIONS

Ben G. Streetman, "Solid State Electronic Devices", Prentice Hall, Fourth Edition, 1995, pp. 61-63.

(Continued)

*Primary Examiner*—Tan T. Nguyen
(74) *Attorney, Agent, or Firm*—Akin Gump Strauss Hauer & Feld, LLP

(57) ABSTRACT

One embodiment of the present invention provides a system having a nonvolatile memory comprising a p type semiconductor substrate, an oxide layer over the p type semiconductor substrate, a nitride layer over the oxide layer, an additional oxide layer over the nitride layer, a gate over the additional oxide layer, two N+ junctions in the p type semiconductor layer, a source and drain respectively formed in the two N+ junctions, a first bit and a second bit in the nonvolatile memory, and accordingly at least two states of operation (i.e., erase and program) therefor. That is, one bit in the nonvolatile memory can either be in an erase state or program state. For erasing a bit, electrons are injected at the gate of the nonvolatile memory. For programming a bit, electric holes are injected or electrons are reduced for that bit. The present invention also provides a method for sensing and reading at least one bit in a nonvolatile memory comprising applying a bias voltage to the memory, detecting a threshold voltage or read current, comparing the threshold voltage with a reference voltage or comparing the read current with a reference current, and identifying the at least one bit as erased or programmed.

30 Claims, 14 Drawing Sheets

U.S. PATENT DOCUMENTS

| | | | | |
|---|---|---|---|---|
| 5,986,942 | A | 11/1999 | Sugibayashi | 365/189.01 |
| 6,067,251 | A * | 5/2000 | Hirano | 365/185.18 |
| 6,091,643 | A * | 7/2000 | Kawakami | 365/185.29 |
| 2002/0000606 | A1 | 1/2002 | Eitan | |
| 2002/0074594 | A1 | 6/2002 | Katayama et al. | |
| 2003/0235083 | A1 | 12/2003 | Swift et al. | |

OTHER PUBLICATIONS

"Annex to the European Search Report" for European Patent Application No. EP 04023844 dated Apr. 8, 2005, 1 page.

* cited by examiner

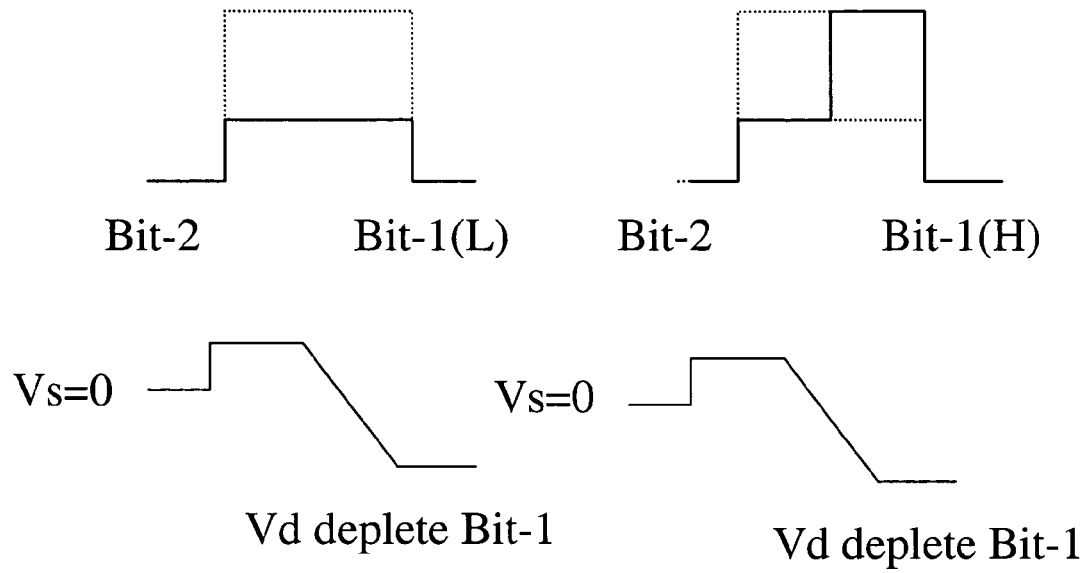
Fig. 6A Read Bit 2 (low)
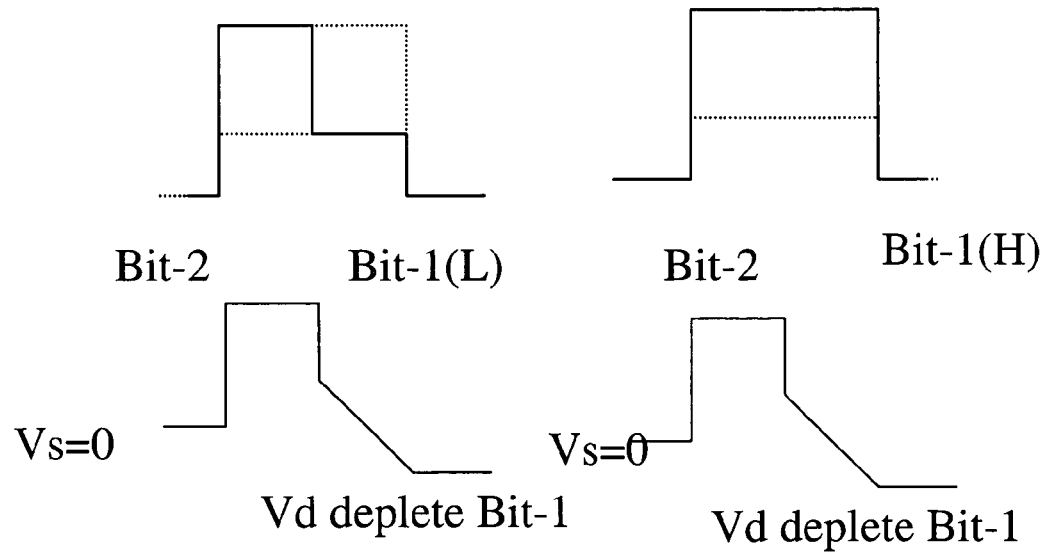
Fig. 6B Read Bit 2 (High)

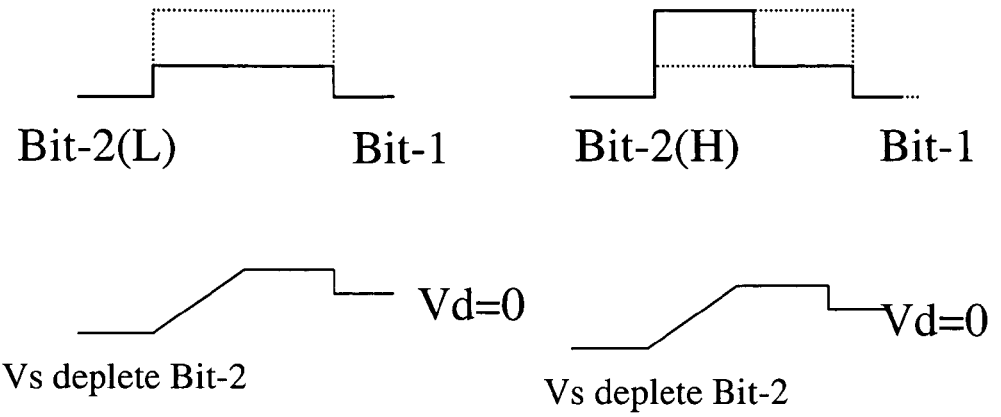
Fig. 6C Read Bit 1 (low)
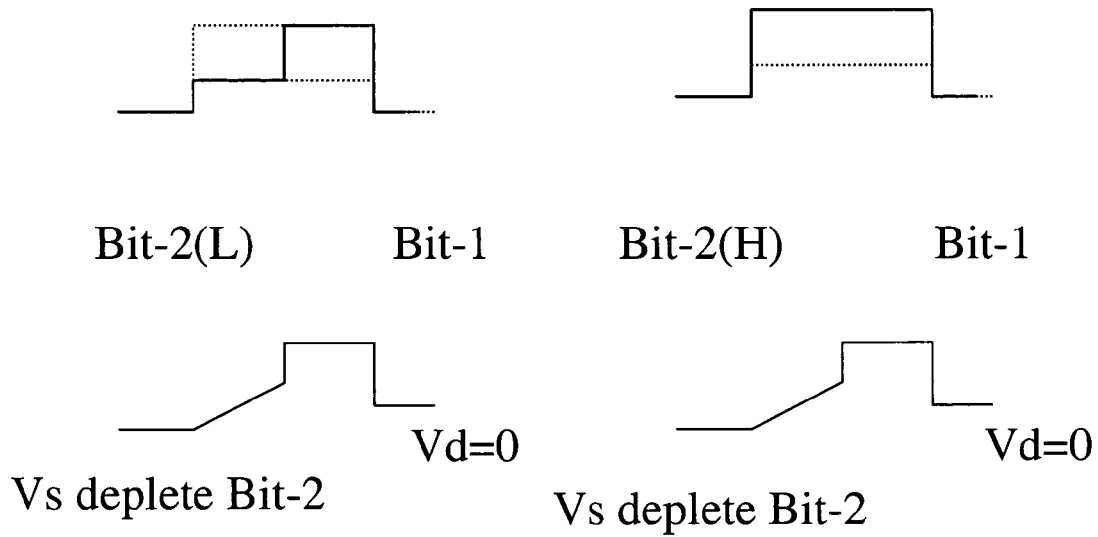
Fig. 6D Read Bit 1 (high)

NONVOLATILE MEMORY CELL AND OPERATING METHOD

RELATED APPLICATIONS

This patent application for the present invention is a continuation-in-part (CIP) of U.S. patent application Ser. No. 10/113,356 filed on Mar. 29, 2002 now U.S. Pat. No. 6,690,601, which is incorporated herein by reference in its entirety.

FIELD OF THE PRESENT INVENTION

The present invention generally relates to semiconductor memory devices and more particularly to a nonvolatile semiconductor memory cell such as flash memory and methods for operating PHINES (programming by hot hole injection nitride electron storage) memory cells.

BACKGROUND OF THE PRESENT INVENTION

Memory devices for nonvolatile storage of information are in widespread use in the art. Exemplary nonvolatile semiconductor memory devices include read only memory (ROM), programmable read only memory (PROM), erasable programmable read only memory (EPROM), electrically erasable programmable read only memory (EEPROM) and flash EEPROM.

Flash EEPROMs are similar to EEPROMs in that memory cells can be programmed (i.e., written) and erased electrically but with the additional capability of erasing all memory cells at once. The widespread use of EEPROM semiconductor memory has prompted much research focusing on developing an EEPROM memory cell with optimal performance characteristics such as shorter programming times, lower voltage usage for programming and reading, longer data retention time, shorter erase time and smaller physical dimensions.

Conventional programming using hot electron injection requires high operating voltages and consumes high power. As the size of the nonvolatile cell is reduced and the channel is relatively small, the high operating voltage induces a punch-through effect resulting in high leakage current and low program efficiency. Such becomes a significant design and implementation shortcoming in prior art nonvolatile memory devices serving as two-bit memory cells. Moreover, the prior art structure requires a particularly confined size, which impedes engineering efforts on size and cost reduction therefor.

There is thus a general need in the art for a device and method overcoming at least the aforementioned shortcomings in the art. A particular need exists in the art for a nonvolatile memory device with an optimal two-bit cell structure, and more particularly, a nonvolatile memory device and associated methods therefor that overcome at least the aforementioned disadvantages of nonvolatile memory devices in the art. In particular, there is a need in the art for a nonvolatile memory device with amplified effects for the trapped electron charges in the trapping dielectric layer and an optimally reduced size.

SUMMARY OF THE INVENTION

Accordingly, one embodiment of the present invention is directed to a nonvolatile memory and method that obviate one or more of the problems due to limitations and disadvantages of the related art.

To achieve these and other advantages, and in accordance with the purpose of the present invention as embodied and broadly described, there is provided a system having a nonvolatile memory comprising a p type semiconductor substrate, an isolation layer over the p type semiconductor substrate, a trapping layer over the isolation layer, an additional isolation layer over the trapping layer, a gate over the additional isolation layer, two N+ junctions in the p type semiconductor layer, a source and drain respectively formed in the two N+ junctions, a first bit and a second bit in the nonvolatile memory, and accordingly at least two states of operation (i.e., erase and program) therefor. That is, one bit in the nonvolatile memory can either be in an erase state or program state. For erasing a bit, electrons are injected at the gate of the nonvolatile memory. For programming a bit, electric holes are injected or electrons are reduced for that bit. The trapping layer is operable to retain electrons in an erase state for at least one bit in the nonvolatile memory, causing the nonvolatile memory to have a threshold voltage, and a read current in a reading operation. In addition, a comparator can be provided for receiving a first input resulting from the read current and a second input in a form of one of a reference voltage and a reference current.

The present invention also provides a method for sensing and reading at least one bit in a nonvolatile memory comprising applying a bias voltage to the memory, detecting a threshold voltage or read current, comparing the threshold voltage with a reference voltage or comparing the read current with a reference current, and identifying the at least one bit as erased or programmed.

A method for operating a nonvolatile memory having at least one bit according to one embodiment of the present invention comprises erasing the at least one bit by retaining electrons in a nitride layer, programming the at least one bit by injecting electric holes, reading the at least one bit by applying a bias voltage, detecting a threshold voltage or a read current for the at least one bit, providing a reference voltage or a reference current, comparing the threshold voltage with the reference voltage or comparing the read current with the reference current. The at least one bit is erased if the threshold voltage is larger than the reference voltage or the read current is lower than the reference current. The at least one bit is programmed if the threshold voltage is lower than the reference voltage or the read current is larger than the reference current.

The nonvolatile memory and method according to the present invention advantageously optimize the speed in sensing and programming memory cells, and accordingly increases the margin for the operation voltage. By optimizing the memory sensing process, the read speed can be increased and the read error significantly reduced. As a result, accuracy in sensing memory cells is advantageously optimized. The distribution of the programming and erasing of memory cells is also advantageously reduced.

Additional advantages of the present invention will be set forth in part in the description which follows, and in part will be obvious from the description, or may be learned by practice of the present invention. The advantages of the present invention will be realized and attained by means of the elements and combinations particularly pointed out in the appended claims.

It is to be understood that both the foregoing general description and the following detailed description are exemplary and explanatory only and are not restrictive of the present invention, as claimed.

The accompanying drawing, which is incorporated in and constitutes a part of this specification, illustrates several embodiments of the present invention and together with the description, serves to explain the principles of the present invention.

BRIEF DESCRIPTION OF THE DRAWINGS

FIG. 6A illustrates an exemplary energy barrier distribution and voltage distribution for reading one bit near the source as the bit is at low state with the bit near the drain in low and high states;

FIG. 6B illustrates an exemplary energy barrier distribution and voltage distribution for reading one bit near the source as the bit is at a high state with the bit near the drain in low and high states;

FIG. 6C illustrates an exemplary energy barrier distribution and voltage distribution for reading one bit near the drain as the bit is at low state with the bit near the drain in low and high states;

FIG. 6D illustrates an exemplary energy barrier distribution and voltage distribution for reading one bit near the drain as the bit is at a high state with the bit near the drain in low and high states;

DESCRIPTION OF THE EMBODIMENTS

Reference will now be made in detail to the present embodiment of the present invention, an example of which is illustrated in the accompanying drawings. Wherever possible, the same reference numbers will be used throughout the drawings to refer to the same or like parts.

Figure 1:
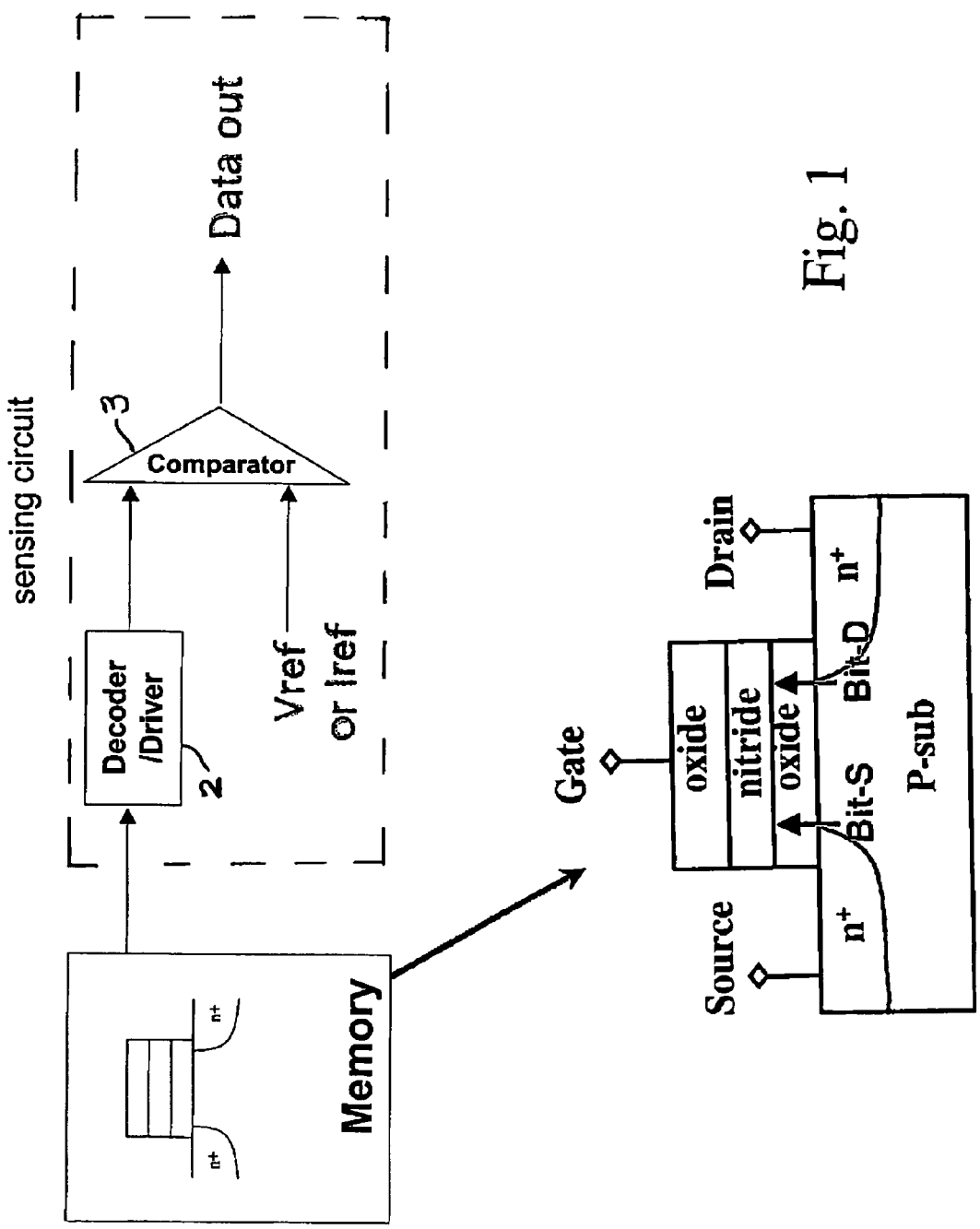
FIG. 1 is a diagram exemplarily illustrating a system according to one embodiment of the present invention.

FIG. 1 is a block diagram of a system according to one embodiment of the present invention, which is not necessarily drawn to scale, in which the dimensions of various components may be arbitrarily increased or reduced. The system according to this particular embodiment comprises a comparator 3 receiving a reference current or voltage ($I_{ref}$ or $V_{ref}$), driver 2 (which can also be a decoder), and nonvolatile memory (PHINES 10). PHINES 10 further comprises a p type semiconductor substrate, an oxide layer over the p type semiconductor substrate, a nitride layer over the oxide layer, an additional oxide layer over the nitride layer, a gate over the additional oxide layer, two N+ junctions in the p type semiconductor layer, a source and drain respectively formed in the two N+ junctions. The oxide layers are the isolation layers, whereas the nitride layer is the trapping layer. A channel (not shown) can be formed between the drain and the source when the nonvolatile memory PHINES 10 is being read. A first bit ("Bit-D" from the drain) and a second bit ("Bit S" from the source) are provided in the nonvolatile memory PHINES 10, and accordingly at least two states of operation (i.e., erase and program) therefor. That is, one bit in the nonvolatile memory can either be in an erase state or program state. For erasing a bit, electrons are injected at the gate of the nonvolatile memory. For programming a bit, electric holes are injected or electrons are reduced for that bit. Table 1, below, generally illustrates the erasing and programming of the first and second bits (Bit-D and Bit-S) in accordance with the principles of the present invention.

TABLE 1

|  | Erase | Program |
| --- | --- | --- |
| Bit-D | Inject electron | Inject holes or reduce electrons at drain side |
| Bit-S | Inject electron | Inject hole or reduce electrons at source side |

In view of FIG. 1 and Table 1, for erasing the first bit (Bit-D), electrons are injected at the gate of the nonvolatile memory PHINES 10. Similarly, for erasing the second bit (Bit-S), electrons are injected at the gate of the nonvolatile memory. For programming the first bit (Bit-D), electric holes are injected at the drain of the nonvolatile memory, or electrons at the drain side are reduced. For programming the second bit (Bit-S), electric holes are injected at the source of the nonvolatile memory, or electrons at the source side are reduced.

The trapping layer is operable to retain electrons in an erase state for at least one bit in the nonvolatile memory, causing the nonvolatile memory to have a threshold voltage, and a read current in a reading operation. In addition, a comparator can be provided for receiving a first input resulting from the read current and a second input in a form of one of a reference voltage and a reference current.

Figure 2:
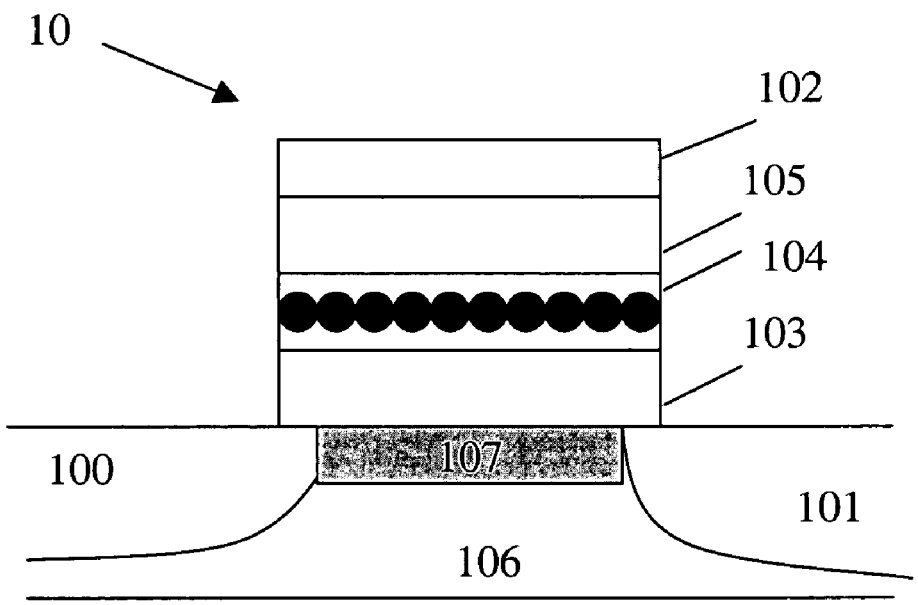
FIG. 2 is a schematic view illustrating one embodiment of the nonvolatile memory cell of the present invention.

The nonvolatile memory cell 10 according to one embodiment of the present invention is illustrated in FIG. 2. The nonvolatile memory cell 10 includes an N-channel MOSFET structure in general. In the nonvolatile memory cell 10, a p type substrate 106 includes two buried N+ junctions, one being the source 100 and the other being the drain 101. A channel 107 is formed between the source 100 and the drain 101. Above the channel is a first isolating layer 103, which generally is a silicon oxide layer. On top of the first isolating layer 103 is a trapping layer 104, which generally is a nitride layer. The trapping layer 104 forms the memory retention layer for trapping the electrons as they are injected into the nitride layer. A second isolating layer 105, which generally is a silicon oxide layer, is formed to overlay the silicon nitride layer. The silicon oxide layer 105 functions to electrically isolate a conductive gate 102 formed over the second isolating layer 105. The two silicon oxide layers 103 and 105 function as isolation dielectric layers.

Numerous advantages of the present invention lie in the manner in which the nonvolatile memory cell 10 is programmed, read and erased. In the erase state, electrons are stored in the nitride layer, so that the energy level in the channel is normally at a high state. In programming the nonvolatile memory cell 10, hot electric holes are injected into the trapping layer 104 from the source 100 or the drain 101 so as to change the energy barrier.

In operating the nonvolatile memory cell according to the present invention, it is desirable to inject the electric holes or electrons into the trapping layer 104 at high speed. It is further desirable to retain the electrons or holes in the trapping layer when the nonvolatile memory cell is not operational. According to a particular embodiment of the present invention, for an isolation layer (such as the first isolating layer 103) the energy barrier is 3.2 eV for electrons and 4.9 eV for the electric holes. Such has a generally equal effect on the electrons and electric holes drawn out of the trapping layer 104 and electrons and holes injected into the trapping layer 104 through the first isolating layer 103. It is further desirable to steadily retain the electrons or electric holes in the trapping layers 104 when the nonvolatile memory cell is not operational. Conversely, when the nonvolatile memory cell according to the present invention is operational, the electrons and holes are readily injected into the trapping layer 104. That is, the electrons and electric holes are passed through an isolation layer with lower energy barriers so as to speed up the operation of the nonvolatile memory cell.

Figure 3:
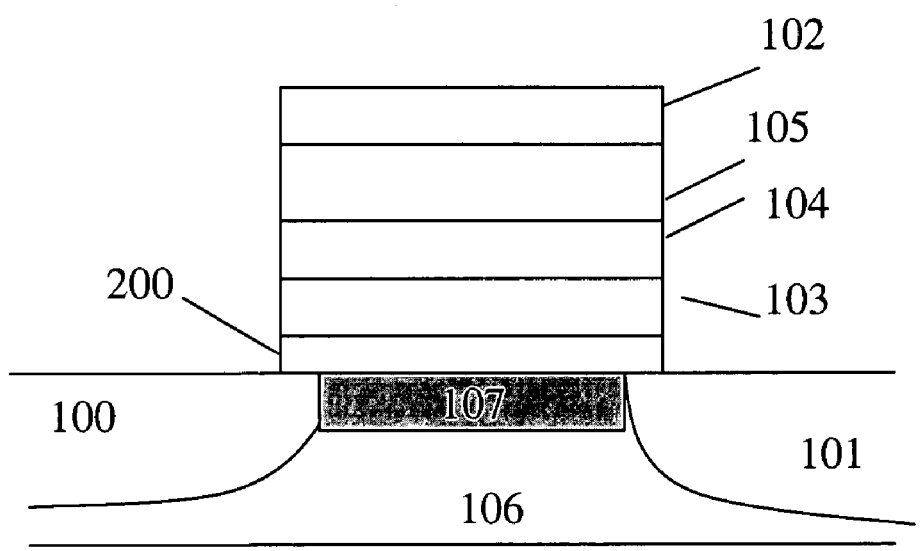
FIG. 3 is a schematic view illustrating a further embodiment of the nonvolatile memory cell of the present invention with a tunneling layer.

FIG. 3 is a schematic view illustrating a further embodiment of the nonvolatile memory cell of the present invention with a tunneling layer.

A tunnel layer 200 is provided between the channel 107 and the first isolating layer 103. The structure disclosed in FIG. 3 is generally similar to the one disclosed in FIG. 2, except that a tunnel layer 200 is added between the channel 107 and the first isolating layer 103. The material of the tunnel layer 200 is particularly selected to provide lower energy barriers to the electrons and electric holes than those of the first isolating layer 103 where the electrons and holes are readily injected into the trapping layer and thus the speed in charge storing in the trapping layer 104 is accordingly increased. Since the first isolating layer 103 remains next to the trapping layer 104, the electrons or electric holes in the trapping layer 104 are retained therein as well. According to a particular embodiment of the present invention, materials for the tunnel layer 200 can be selected from tantalum oxide or BST (i.e., a compound of barium, strontium, and tantalum).

In the erase state in operating the nonvolatile memory according to this particular embodiment of the present invention, the electrons are stored in the trapping layer 104. In programming the nonvolatile memory according to the present invention, hot electric holes are injected into the trapping layer 104.

Figure 4A:
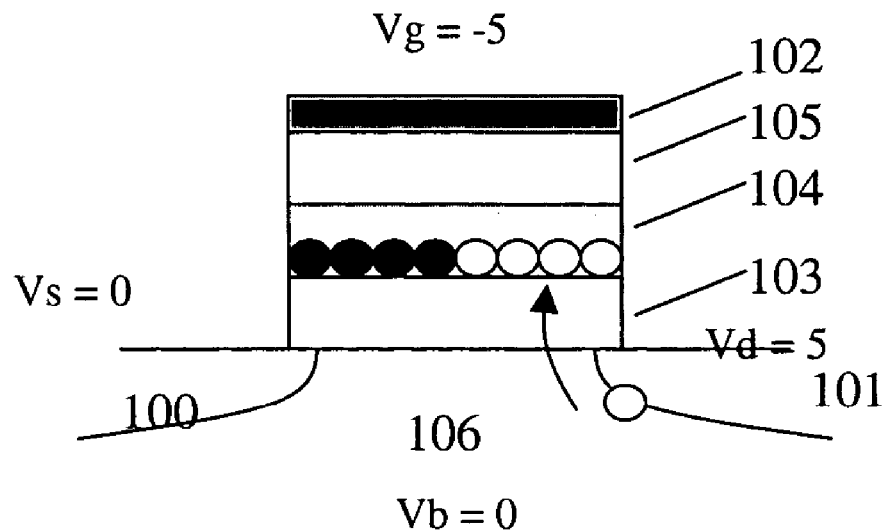
FIGS. 4A and 4B are a schematic views respectively illustrating an exemplary operation of programming the source bit and drain bit of the nonvolatile memory cell according to one embodiment of the present invention.
Figure 4B:
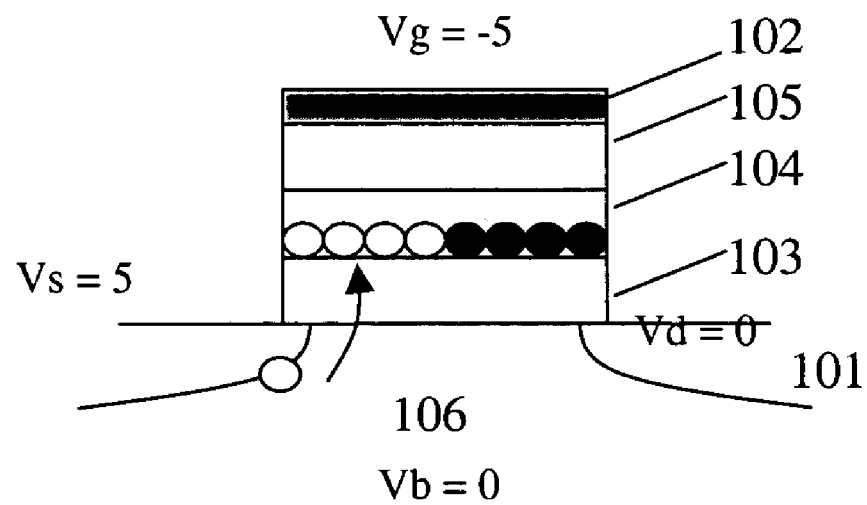

The operation of the flash memory cell 100 from the drain bit is described in further detail. FIG. 4A is a schematic view that illustrates an exemplary operation for programming the drain bit according to the present invention. To program or write the nonvolatile memory cell of the present invention, a voltage difference is formed between the drain 101 and the gate 102, where the source 100 is grounded. For example, a voltage of −5 volts (V) is applied to the gate 102 and 5 V is applied to the drain 101. These voltages generate a vertical and lateral electric field along the length of the channel from the drain 101 to the gate 102. This electric field causes the electric holes to be drawn off the drain 101 and accelerate towards the source. The electric holes gain energy as they move along the length of the channel. When the electric holes gain sufficient energy, they are able to jump over (or tunnel through) the potential barrier of the silicon oxide layer 103 into the trapping layer 104 where they are trapped. The probability of this occurring is at a maximum in the region of the gate next to the drain 101 because it is near the drain 101 where the holes gain the most energy. These accelerated holes are termed hot holes. Once the hot holes are injected into the nitride layer, they become trapped and remain stored therein. The trapped holes cannot spread through the nitride layer because of the low conductivity of the nitride layer and the lateral electric field. Thus, the trapped charge remains in a localized trapping region typically located close to the drain. Moreover, FIG. 4B is a schematic view that illustrates an exemplary operation for programming the source bit according to the present invention. The programming of the source bit is generally similar to the programming of the drain bit, except that the voltages applied to the source 100 and drain 101 is interchanged so as to generate a different effect.

Figure 5A:
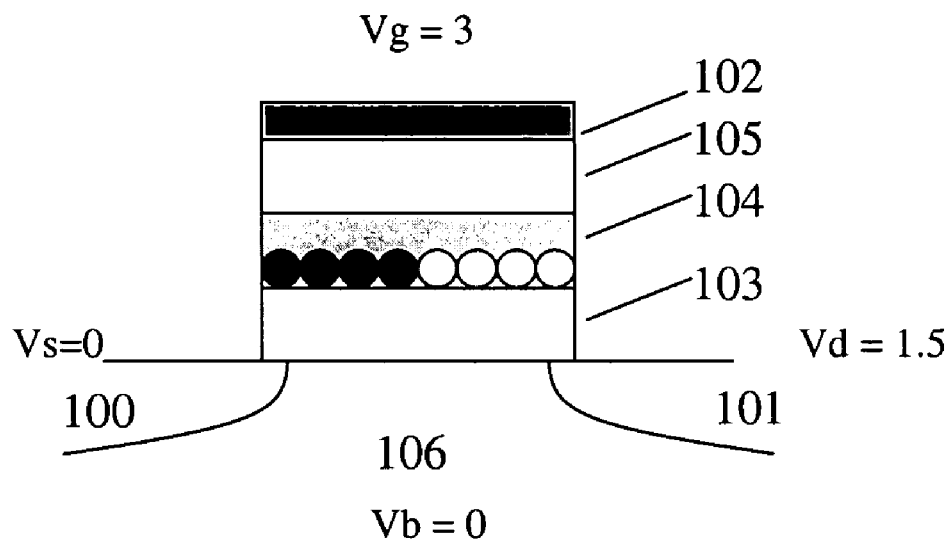
FIGS. 5A and 5B are schematic views respectively illustrating an exemplary operation of reading the source bit and drain bit of the nonvolatile memory cell according to another embodiment of the present invention.

FIG. 5A is a schematic view that illustrates an exemplary operation of reading the source bit of the nonvolatile memory cell according to the present invention. If it is desired to read a bit stored in the trapping layer near the source 100, a positive voltage is applied to the gate 102 and the drain 101 while the source 100 is grounded. The lower limit for the positive voltage applied to the gate 102 is the voltage at which sufficient inversion is generated in the channel 107 where by the programmed state can be sensed. The positive voltage applied to the drain 101 reduces the energy barrier and potential across the bit stored near the drain 101, resulting in the channel current. FIG. 6A illustrates the energy barrier distribution and voltage distribution for reading the bit near the source as it is at low state with the bit near the drain in low and high states. FIG. 6B illustrates the energy barrier distribution and voltage distribution for reading the bit near the source as it is at a high state with the bit near the drain in low and high states.

Figure 5B:
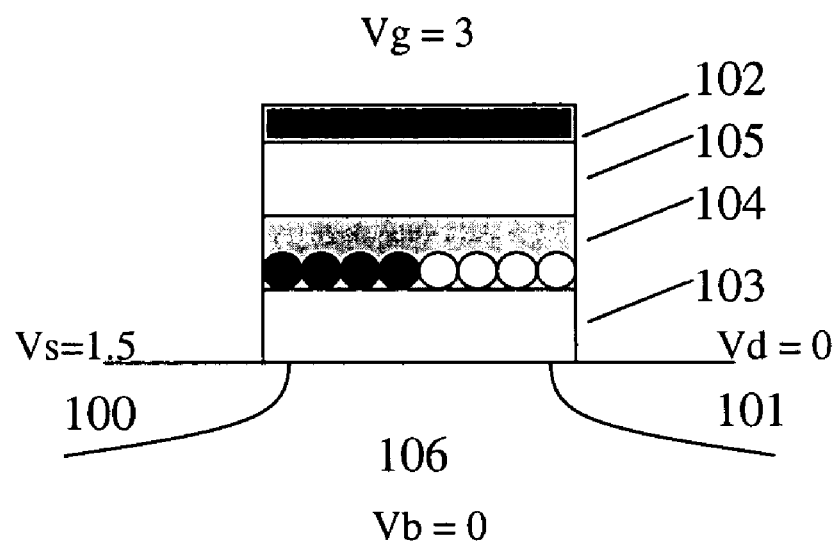

When the device reads the bit in the trapping layer 104 near the drain, as illustrated in FIG. 5B, a positive voltage is applied to the gate 102 and source 100 while the drain 101 is grounded. The lower limit for the positive voltage applied to the gate 102 is the voltage at which sufficient inversion is generated in the channel 107 where by the programmed state can be sensed. The positive voltage applied to the source 100 reduces the energy barrier and potential across the bit stored near the source 100, resulting in the channel current. FIG. 6C illustrates the energy barrier distribution and voltage distribution for reading the bit near the drain as it is in a low state with the bit near the drain in both low and high states. FIG. 6D illustrates the energy barrier distribution and voltage distribution for reading the bit near the drain as it is in a high state with the bit near the drain in both low and high states.

Figure 7:
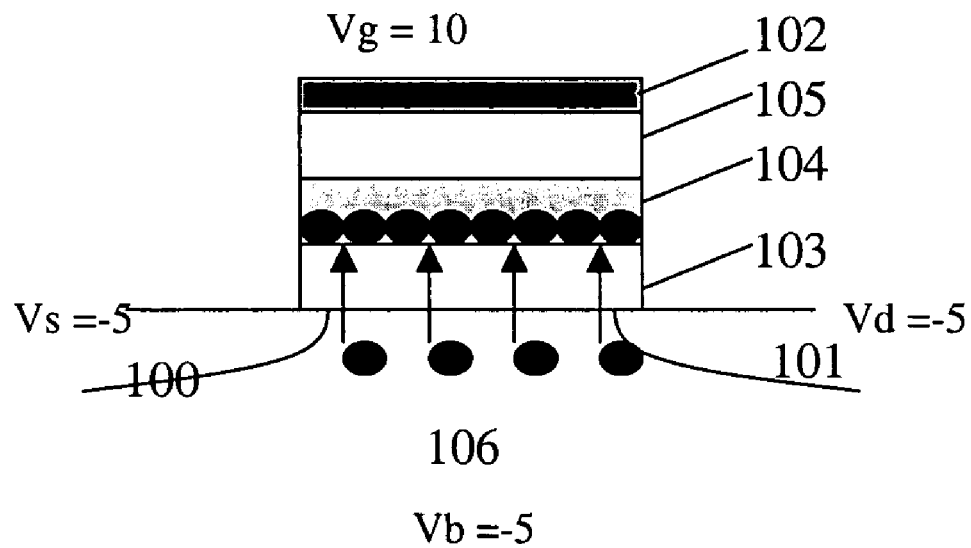
FIG. 7 illustrates an exemplary erase operation according to the present invention where electrons are injected into the trapping layer from the semiconductor substrate.

FIG. 7 illustrates an exemplary erase operation of the FN (Fowler-Nordheim) injection method according to one embodiment of the present invention where electrons are injected into the trapping layer from the semiconductor substrate. The nonvolatile memory cell according to the present invention is erased using uniform electron injection by Fowler-Nordheim tunneling with a positive gate-to-drain/source/substrate bias for substrate injection.

Figure 8:
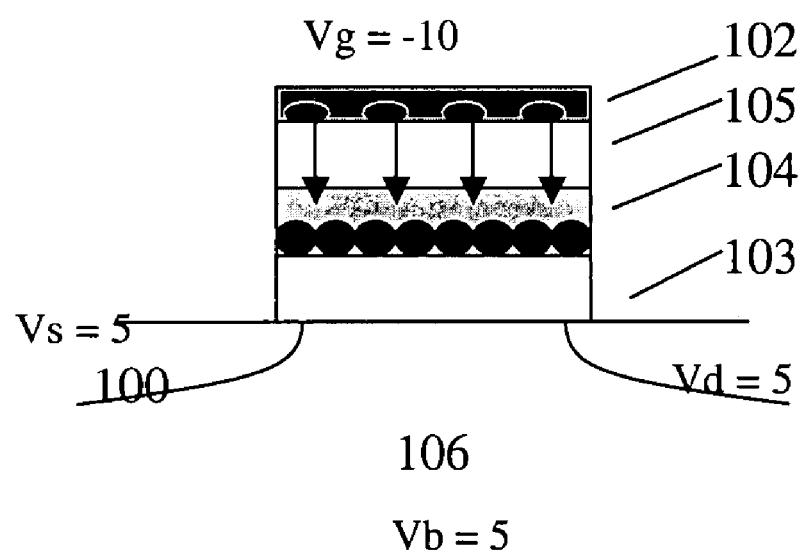
FIG. 8 illustrates another exemplary erase operation according the present invention where electrons are injected into the trapping layer from the gate.

To erase the nonvolatile memory cell, a substrate injection method is utilized. Voltages are applied to the source 100, drain 101, substrate 106 and the gate 102. For example, a voltage of 10 V is applied to the gate and a voltage of −5V is applied to the drain 101, substrate 106 and source 100. These voltages generate a vertical electric field along the channel region 106 to the gate 102. This electric field causes electrons to be drawn out of the channel region which then tunnel towards the gate. The electrons are able to tunnel through the potential barrier of the silicon oxide layer 103 to be injected into the trapping layer 104 where they are trapped. The tunneling electrons are injected into the nitride layer where they are trapped and remain stored therein. Furthermore, voltages can be used for an erase operation of the nonvolatile memory cell according to the present invention using a negative gate-to-drain/source/substrate bias for substrate injection. FIG. 8 illustrates another exemplary erase operation according the present invention where electrons are injected into the trapping layer from the gate using the FN (Fowler-Nordheim) injection method. Voltages are accordingly applied to the source 100, the drain 101, substrate 106 and the gate 102. For example, a voltage of −10 V is applied to the gate and 5V is applied to the drain 101, substrate 106 and source 100. These voltages generate a vertical electric field along the length of the gate 102 to the nitride layer 104. This electric field causes electrons to be drawn off the gate 102 and to tunnel towards the nitride layer 104. The electrons are able to tunnel through the potential barrier of the second isolation layer 105 into the trapping layer 104 where they are trapped. These tunneling electrons are injected into the trapping layer where they are trapped and remain stored therein.

Figures 9, 10:
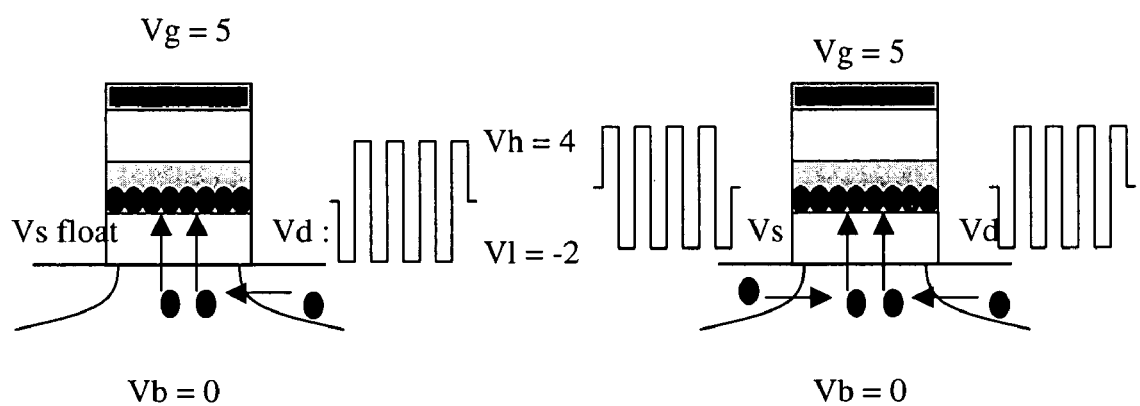
FIG. 9 illustrates an exemplary erase operation for the flash memory cell according the present invention using hot electron injection from the drain by pulse agitating the substrate.
FIG. 10 illustrates another exemplary erase operation of the flash memory cell according to the present invention using hot electron injection from the source and drain by pulse agitating the substrate.

FIG. 9 illustrates an exemplary erase operation for the flash memory cell according the present invention using hot electron injection from the drain by pulse agitating the substrate. The memory cell is erased by pulse-agitating the substrate with hot electron injection, where the gate 102 is positively biased, the source 100 is floated and the substrate is grounded, as a series of bipolar pulses are input to the drain 101. According to this particular embodiment of the present invention, the voltage of the gate is 5 V, where the high voltage of the pulse is 4 V and the lower voltage thereof is −2V. As a negative pulse is input to the drain 101, the electrons in the drain consequently flow out of the drain 101 to the source 100. As a result of applying a positive pulse to the drain 101, the channel between drain 101 and source 100 is cut off. As a charge depletion region is formed in the substrate 106 and an electric field is generated along a path from the drain 101 to the gate 102, the electrons flowing out of the drain 101 are directed to the gate 102 and are then trapped in the trapping layer 104 so as to complete the erase operation. In another embodiment according to the present invention, the serial pulses can be input from the source 100 with the drain being floated to achieve generally the same result.

FIG. 10 illustrates yet another exemplary erase operation of the flash memory cell according to the present invention using hot electron injection from the source and drain by pulse agitating the substrate. According to this particular embodiment of the present invention, the gate 102 is positive biased and the substrate 106 is grounded. A series of bipolar pulses are input to the drain 101 and source 100 synchronously. When negative pulses are applied to the source 100 and drain 101, electrons are drawn off the source 100 and drain 101 which then accelerate towards the channel 107. As the positive pulses are applied to the source 100 and drain 101, a charge depletion region is formed in the substrate 106 and a vertical electric field is generated along the path from the channel 107 to the gate 102. The vertical electric field pumps the electrons out of the source 100 and the drain 101 to pass through the first silicon oxide layer 103 to the trapping layer 104. After a filling the trapping layer with electrons for a period of time, the trapping layer 104 is full of electrons so as to erase the original state in the nitride layer.

Figure 11:
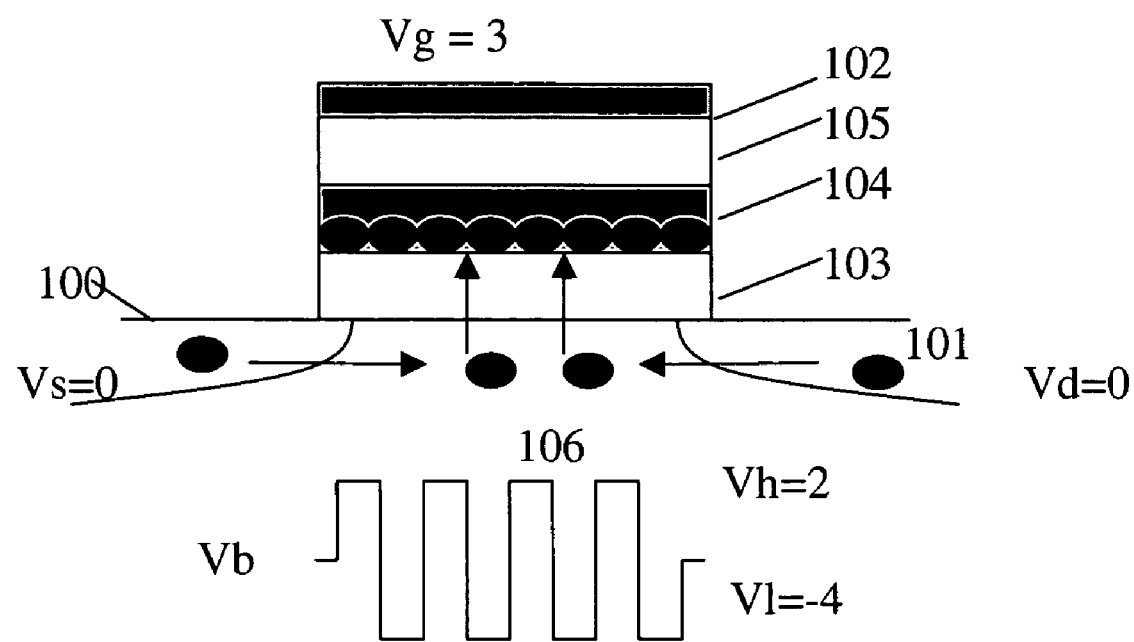
FIG. 11 illustrates yet another exemplary erase operation of the flash memory cell according to the present invention using hot electron injection by pulse agitating the semiconductor substrate.

Moreover, the pulse can be directly applied to the substrate 106 for pumping electrons to the trapping layer. FIG. 11 illustrates yet another exemplary erase operation of the flash memory cell according to the present invention using hot electron injection by pulse agitating the semiconductor substrate. Electrons are pumped out of the substrate layer 106 which then flow to the trapping layer 104 through the first isolating layer 103. A positive voltage of (e.g., 3 V) is applied to the gate 102 with the source 100 and the drain 101 being grounded. A series of pulses with a high state of 2 V (for example) and a lower level of −4V (for example) are applied to the substrate 106. As a positive voltage is applied, electrons are drawn out of the source 100 and drain 101. As negative voltage is applied, the electrons out of the source 100 and drain 101 are pumped upwards to the trapping layer 104. After a filling the trapping layer with electrons for a period of time, the trapping layer 104 is full of electrons so as to erase the original state in the nitride layer.

Figure 12:
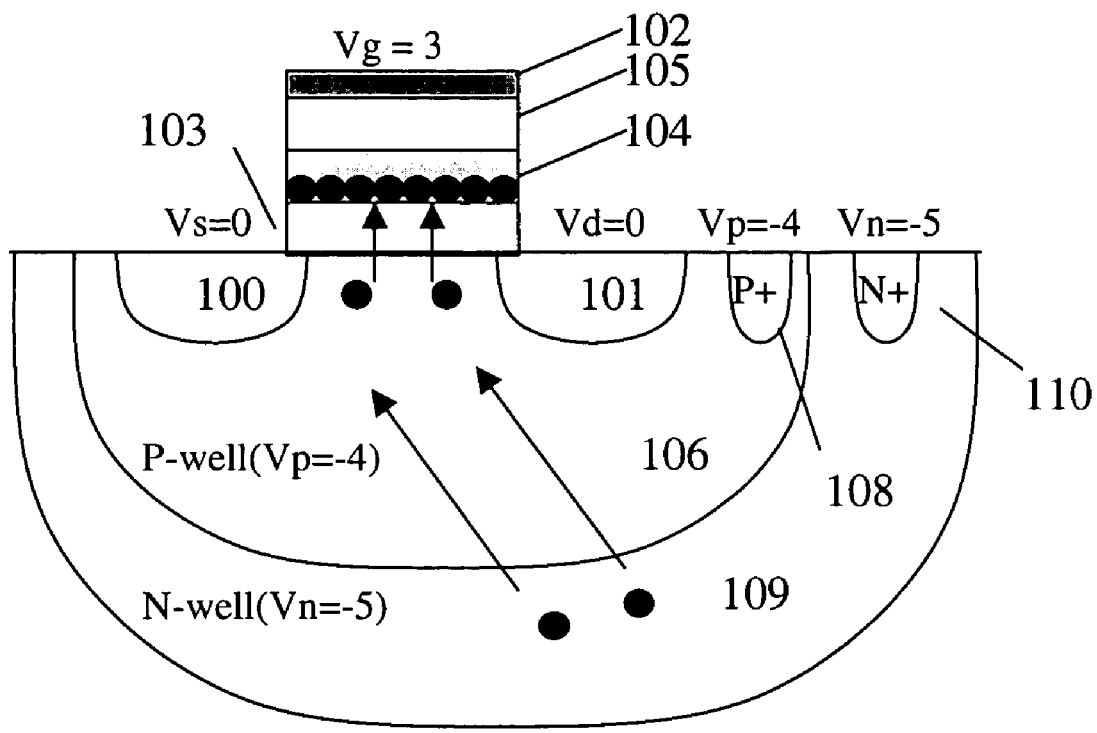
FIG. 12 illustrates a further exemplary erase operation of the nonvolatile memory cell according to the present invention using electron injection with hot electrons emitted from the N well.

FIG. 12 illustrates a further exemplary erase operation of the nonvolatile memory cell according to the present invention using electron injection with hot electrons emitted from the N well. The nonvolatile memory cell according to the present invention is erased by hot electron injection, where an N well is provided around the substrate of the nonvolatile memory cell. With a positive gate-to-drain/source bias and a positive P-well-to-N-well bias, electrons are emitted from the N well, injected into the P well and trapped in the cell, where the substrate 106 acts as the P well according to this particular embodiment of the present invention. An N well 109 is formed to enclose the substrate 106. A P+ area 108 is formed in the P well, which is located, but not limited, to the right side of the N+ drain area 101 according to this embodiment. The P+ area 108 is metalized to serve as a joint to be connected to an outer component. The N well 109 further enclosing the P well includes an N+ area 110. The N+ area 110 is located at, but not limited to, one side of the P+ area 108. The N+ area 110 is metalized to serve a joint to be connected to an outer component. A voltage is provided between the gate 102 and the N well 109 so as to pump electrons from the N well to the semiconductor substrate 106 which then flow to the trapping layer 104. The N well of this relatively large size as illustrated in FIG. 12 advantageously provides a significantly large amount of electrons to be injected to the trapping layer by using a relatively small voltage.

It should be understood that the particular amounts of voltages described herein and above in conjunction with FIG. 12 simply encompass one set of available conditions for performing the erase operation for the nonvolatile memory in accordance with the present invention.

Figure 13:
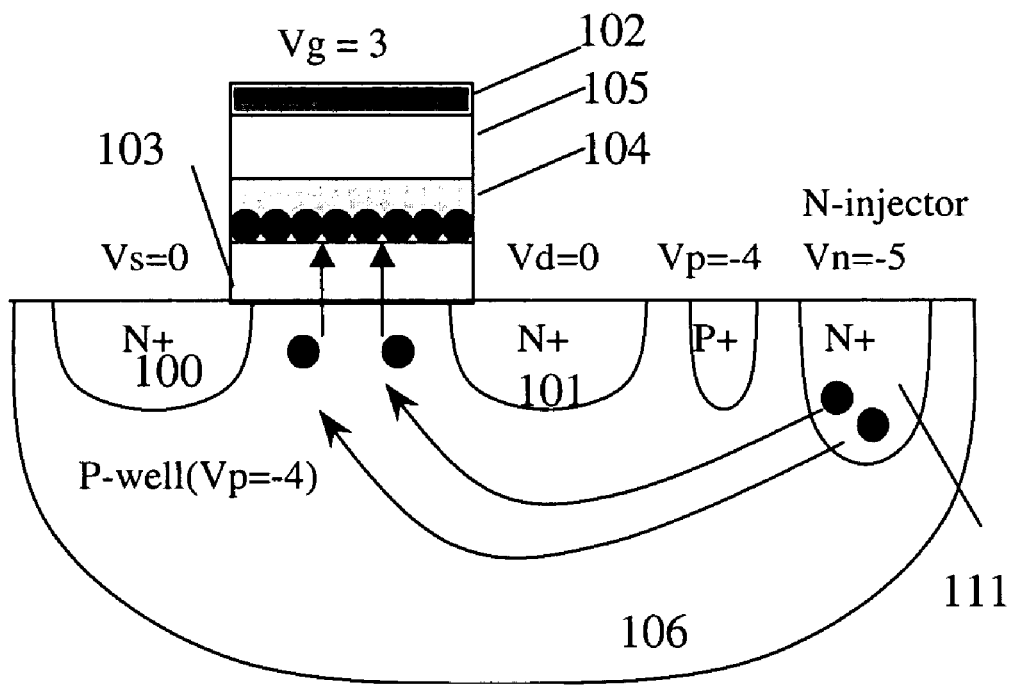
FIG. 13 illustrates an additional exemplary erase operation of the nonvolatile memory cell according to the present invention using electron injection with hot electrons emitted from the N injector.

FIG. 13 illustrates an additional exemplary erase operation of the nonvolatile memory cell according to the present invention using electron injection with hot electrons emitted from N injector. The nonvolatile memory cell according to the present invention is erased by hot electron injection, where an N+ injector is provided in the substrate of the nonvolatile memory cell. With a positive gate-to-drain/source bias and a positive P-well-to-N+ injector bias, electrons are emitted from the N+ injector, and then injected into the P well where they are trapped in the memory cell, where the substrate 106 acts as the P well according to this particular embodiment of the present invention. An N+ injector 111 is formed in the P well, which serves to provide electrons to the P well which are then injected to the trapping layer 104. A P+ area 108 is formed in the P well. The P+ area 108 is metalized to serve as a joint to be connected to an outer component. According to this embodiment of the present invention, the N+ injector 111 and P+ area 108 are located at, but not limited to, the right side of the N+ drain area 101. A voltage is provided between the gate 102 and the N+ injector 110 so as to pump electrons from the N+ injector into the P well which then flow to the trapping layer 104. The N well of this relatively large size as illustrated in FIG. 12 advantageously provides a significantly large amount of electrons to be injected to the trapping layer by using a relatively small voltage.

For programming the nonvolatile memory in accordance with the present invention, the channel is turned off. No current will flow from the drain 101 to the source 100 or along a reverse path as a result. Thus, the present invention advantageously prevents the occurrence of punch-through effects which result in large leakage current, high power consumption and low programming efficiency, and the two bits in the memory cell can be well identified. For the erase operation, electrons are stored in the trapping layer where the energy barrier in the channel is increased. The level of the energy barrier in the channel is uniformly distributed in the regions covering the two bits, a bit 1 and a bit 2, in the nonvolatile memory cell. As bit 1 is programmed, the energy barrier on the side of bit 1 is lowered by depleting the trapped electrons or hot holes injecting, compensating and recombining the amount of carriers in the trapping layer. As bit 2 is programmed, the energy barrier in the side of bit 2 is lowered by depleting the trapped electrons or hot holes injecting, compensating and recombining the amount of carriers in the trapping layer. When the bits 1 and 2 are programmed, both energy barriers of bit 1 and bit 2 are lowered. Since the voltage from the gate will cut off the channel, no current will punch through the channel. Current paths are only formed between the drain and the trapping layer or between the source and the trapping layer. When the bits 1 and 2 in the trapping layer are very close (e.g., adjacent to one another), there is advantageously no resolution reduction for identifying the two bits.

In above embodiment, the method for programming the trapping layer is by injecting holes to the layer. As holes are injected to the trapping layer, it has the effect of reducing net charges in the trapping layers. Drawing electrons out of the trapping layers also achieve substantially the same result. Thus, the method of drawing electrons out of the trapping layer for programming the nonvolatile memory cells is also within the scope of the present invention.

Once the bits in the nonvolatile memory are erased or programmed, at least one bit will be read and sensed in obtaining information stored therein. A method for operating a nonvolatile memory having at least one bit according to one embodiment of the present invention comprises erasing the at least one bit by retaining electrons in a nitride layer, programming the at least one bit by injecting electric holes (or by electron reduction), reading the at least one bit by applying a bias voltage, detecting a threshold voltage or a read current for the at least one bit, providing a reference voltage or a reference current, comparing the threshold voltage with the reference voltage or comparing the read current with the reference current. The at least one bit is erased if the threshold voltage is larger than the reference voltage or the read current is lower than the reference current. The at least one bit is programmed if the threshold voltage is lower than the reference voltage or the read current is larger than the reference current.

A method for operating and reading a nonvolatile memory having a drain bit and a source bit is also provided in accordance with a further embodiment of the present invention. The method according to this particular embodiment comprises erasing one of the drain bit and the source bit by retaining electrons in a nitride layer in the nonvolatile memory, programming the drain bit by injecting electric holes in a drain (or by electron reduction) in the nonvolatile memory, programming the source bit by injecting electric holes in a source (or by electron reduction) in the nonvolatile memory, reading the drain bit and the source bit by applying a bias voltage to the source and the drain, respectively. In one aspect, the method according to the present invention further comprises respectively detecting a threshold voltage or a read current for the drain bit and the source bit, respectively comparing the threshold voltage with a reference voltage for the drain bit and the source bit or respectively comparing the read current with a reference current for the drain bit and the source bit. The drain bit is erased if, at the drain, the threshold voltage is larger than the reference voltage or the read current is lower than the reference current. The source bit is erased if, at the source, the threshold voltage is larger than the reference voltage or the read current is lower than the reference current. The drain bit is programmed if, at the drain, the threshold voltage is lower than the reference voltage or the read current is larger than the reference current. The source bit is programmed if, at the source, the threshold voltage is lower than the reference voltage or the read current is larger than the reference current.

Figure 14:
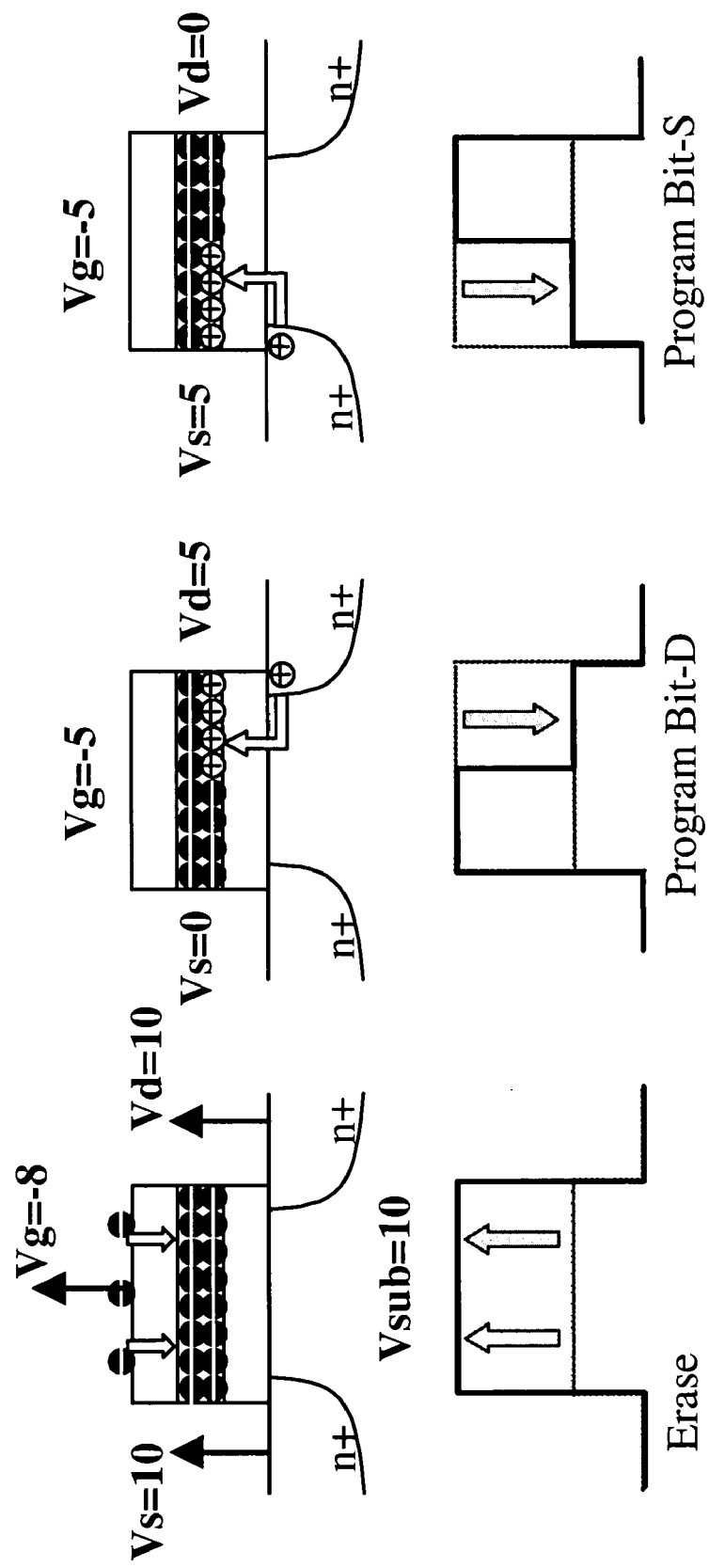
FIG. 14 is a diagram exemplarily illustrating the erased and programmed bits of the nonvolatile memory in a system according to one embodiment of the present invention.

As illustrated above and herein, once the bits in the nonvolatile memory have been erased or programmed in operation of the nonvolatile memory, at least one bit will be read and sensed in obtaining information stored therein. FIG. 14 is a diagram exemplarily illustrating the two bits of the nonvolatile memory PHINES 10 in a system according to one embodiment of the present invention as they have been erased and programmed. FIG. 14 illustrates three scenarios, namely, when both bits in the nonvolatile memory have been erased, the first bit Bit-D programmed and the second bit Bit-S programmed.

For reading the bits in the nonvolatile memory, a bias voltage will be applied. A threshold voltage $V_t$ or read current $I_{read}$ will be detected in sensing and reading the nonvolatile memory. Driver 2 and comparator 3 (shown in FIG. 1 in conjunction with PHINES 10) will be used in sensing and reading the nonvolatile memory. For reading the first of the two bits (Bit-D) on the drain side, a bias voltage will be applied to the source. Conversely, for reading the second of the two bits (Bit-S) on the source side, a bias voltage will be applied to the drain.

In applying the bias voltage to the nonvolatile memory PHINES 10 as both bits Bit-D and Bit-S are erased, electrons are injected at the gate and then stored in the nitride layer in the nonvolatile memory, e.g. with the substrate voltage $V_{sub}$ at 10 volts (V), gate voltage (Vg) at −8 V, source voltage Vs at 10 V and drain voltage Vd at 10 V. In applying the bias voltage to the nonvolatile memory as the first bit (Bit-D) is programmed, electric holes are injected, or electrons are reduced, at the drain of the nonvolatile memory, e.g. with Vg at −5 V, Vs at 0 V and Vd at 5 V. In applying the bias voltage as the second bit (Bit-S) is programmed, electric holes are injected, or electrons are reduced, at the source, e.g. with Vg at −5 V, Vs at 5 V and Vd at 0 V.

In view of FIG. 1, $I_{ref}$ or $V_{ref}$ are input into comparator 3 for respective comparison with the read current $I_{read}$ and threshold voltage $V_t$. Through the respective comparison with $I_{ref}$ or $V_{ref}$, the read current $I_{read}$ or threshold voltage $V_t$ can be individually and severally be identified as high or low. With the high/low information for Iread or Vt, the bits in the nonvolatile memory can be accordingly identified. That is, a bit can be identified as programmed (e.g. signifying stored information as 0) or identified as erased (e.g. signifying stored information as 1).

Figure 15:
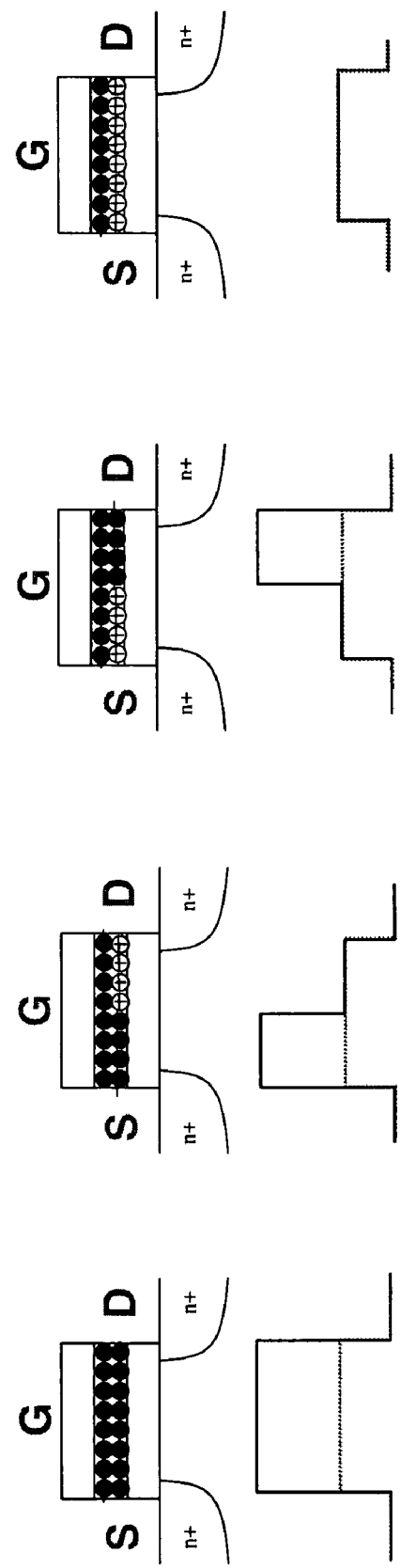
FIG. 15 is a diagram exemplarily illustrating the operation for the nonvolatile memory in a system according to one embodiment of the present invention.

FIG. 15 is a diagram exemplarily illustrating the sensing and reading of the two bits in the nonvolatile memory PHINES 10 in a system according to one embodiment of the present invention. In the erased state for both bits Bit-D and Bit-S, a high threshold voltage $V_t$ or low read current $I_{read}$ with respect to the reference voltage $V_{ref}$ or reference current $I_{ref}$ (at comparator 3) will be detected. If Bit-D is programmed and Bit-S is erased, a low $V_t$ or high $I_{read}$ will be detected for Bit-D, and a high $V_t$ or low $I_{read}$ for Bit-S, respectively. If Bit-D is erased and Bit-S is programmed, a high $V_t$ or low $I_{read}$ will be detected for Bit-D, and a low $V_t$ or high $I_{read}$ for Bit-S, respectively. If both bits are programmed, a low $V_t$ or high $I_{read}$ will be detected for Bit-D, and a low $V_t$ or high $I_{read}$ for Bit-S, respectively. Table 2, below, capsules the high/low relationship of $V_t$ and $I_{read}$ with respect to the erased and programmed states of operation for the 2-bit nonvolatile memory PHINES 10.

TABLE 2

|  |  | Sense $I_{read}$ | Sense $V_t$ |
|---|---|---|---|
| Bit-D | Programmed | High $I_{read}$ | Low $V_t$ |
|  | Erased | Low $I_{read}$ | High $V_t$ |
| Bit-S | Programmed | High $I_{read}$ | Low $V_t$ |
|  | Erased | Low $I_{read}$ | High $V_t$ |

Figure 16:
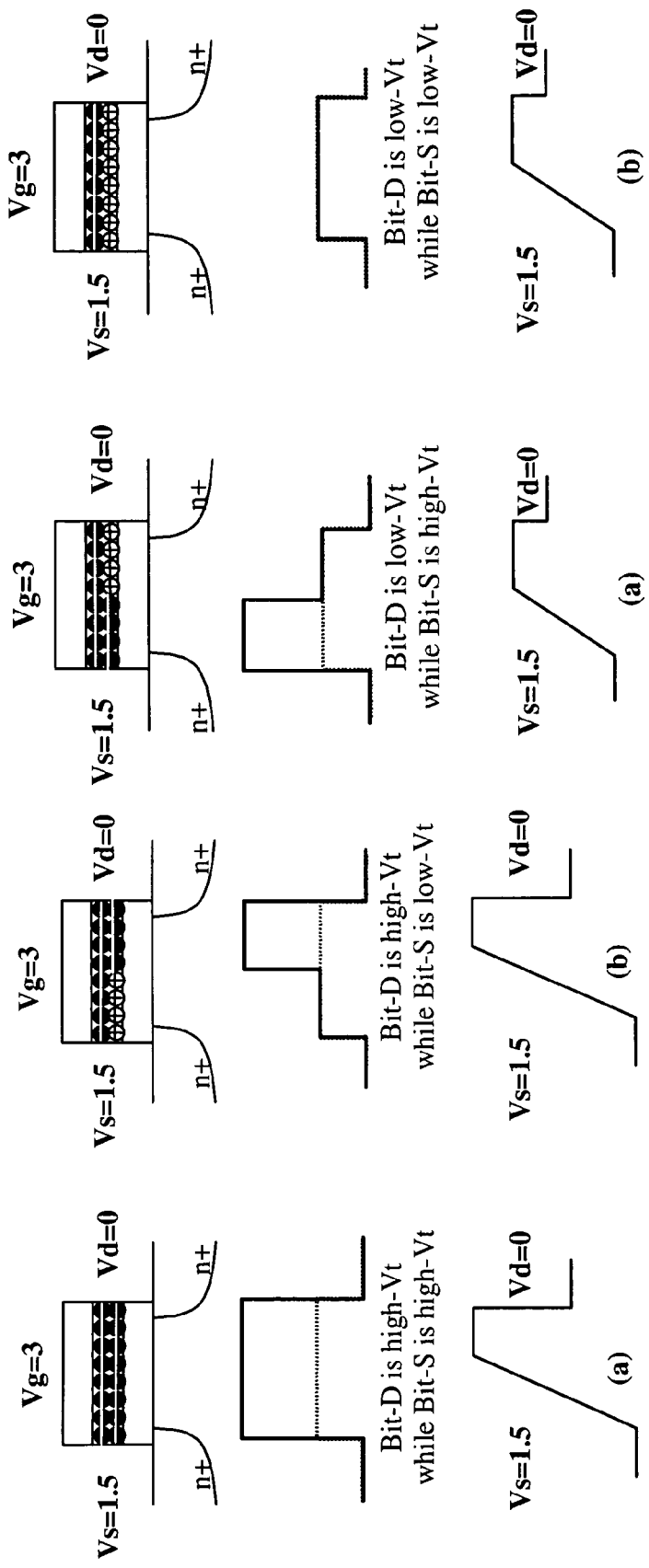
FIGS. 16 and 17 are diagrams respectively illustrating a read operation for each of the two bits in the nonvolatile memory of a system according to one embodiment of the present invention.

FIG. 16 is a diagram exemplarily illustrating a read operation with respect to the first bit Bit-D in the 2-bit nonvolatile memory of a system according to one embodiment of the present invention. A bias is applied at the gate and source with the drain being grounded for pulling down the potential at the source. Table 3, below, capsules the bias relationship with respect to the gate, drain and source voltages (as grounding and positive voltages are individually and severally applied) for the two bits Bit-D and Bit-S in the nonvolatile memory PHINES 10.

TABLE 3

|  | Vg | Vd | Vs |
|---|---|---|---|
| Bit-D | + | 0 | + |
| Bit-S | + | + | 0 |

In the first instance, with the gate voltage Vg at 3 V, source voltage Vs at 1.5 V and drain voltage Vd at 0 V, the threshold voltage $V_t$ will be high for Bit-D. In the second instance where electric holes are injected at the source side, with the gate voltage Vg at 3 V, Vs at 1.5 V and Vd at 0 V, the threshold voltage $V_t$ will be high for Bit-D. In the third instance where electric holes are injected at the drain side, with the gate voltage Vg at 3 V, Vs at 1.5 V and Vd at 0 V, the threshold voltage $V_t$ will be low for Bit-D. In the fourth instance where electric holes are injected at the source and drain, with the gate voltage Vg at 3 V, Vs at 1.5 V and Vd at 0 V, the threshold voltage $V_t$ will be low for Bit-D. These high/low relationships for $V_t$ are used in determining whether the bits are in erased or programmed states, as discussed herein and above.

Figure 17:
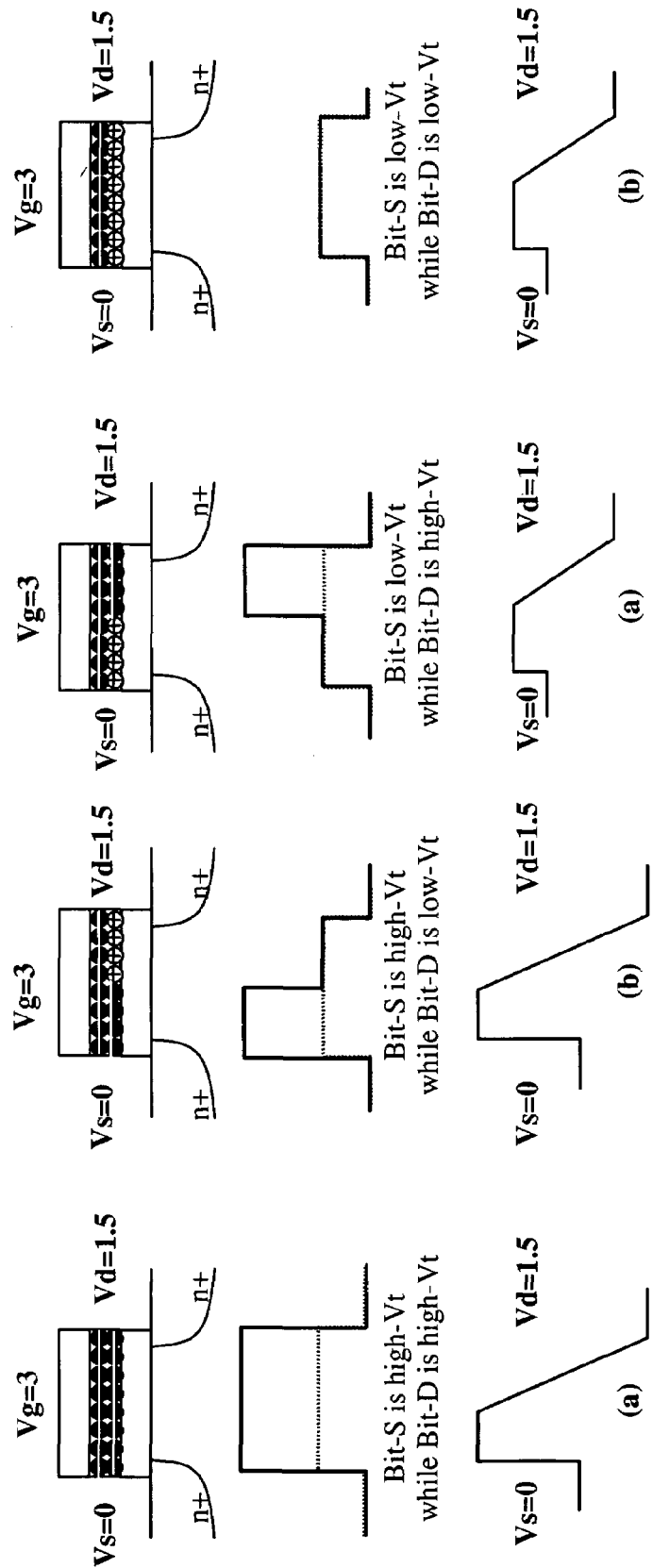

FIG. 17 is a diagram exemplarily illustrating a read operation with respect to the second bit Bit-S in the 2-bit nonvolatile memory of a system according to one embodiment of the present invention. A bias is applied at the gate and drain with the source being grounded for pulling down the potential at the drain. In the first instance, with the gate voltage Vg at 3 V, source voltage Vs at 0 V and drain voltage Vd at 1.5 V, the threshold voltage $V_t$ will be high for Bit-S. In the second instance where electric holes are injected at the source side, with Vg at 3 V, Vs at 0 V and Vd at 1.5 V, the threshold voltage $V_t$ will be low for Bit-S. In the third instance where electric holes are injected at the drain side, with Vg at 3 V, Vs at 0 V and Vd at 1.5 V, the threshold voltage $V_t$ will be high for Bit-S. In the fourth instance where electric holes are injected at the source and drain, with Vg at 3 V, Vs at 0 V and Vd at 1.5 V, the threshold voltage $V_t$ will be low for Bit-S. These high/low relationships for $V_t$ are used in determining whether the bits are in erased or programmed states, as discussed herein and above.

The nonvolatile memory and method according to the present invention advantageously optimize the speed in sensing and programming memory cells, and accordingly increases the margin for the operation voltage. By optimizing the memory sensing process, the read speed can be significantly increased and the read error accordingly reduced. As a result, accuracy in sensing memory cells is advantageously optimized. The distribution of the programming and erasing of memory cells is also advantageously reduced.

Other embodiments of the present invention will be apparent to those skilled in the art from consideration of the specification and practice of the present invention disclosed herein. It is intended that the specification and examples be considered as exemplary only, with a true scope and spirit of the present invention being indicated by the following claims.

We claim:

1. An electronic circuit comprising:

a nonvolatile memory having at least one bit and further comprising a p type semiconductor substrate, a first isolation layer over the p type semiconductor substrate, a trapping layer over the first isolation layer, a second isolation layer over the trapping layer, a gate over the second isolation layer, two N+ junctions in the p type semiconductor substrate, and a source and a drain respectively formed on the N+ junctions;

the trapping layer being operable to retain electrons in an erase state for at least one bit in either side of the trapping layer of the nonvolatile memory, causing the nonvolatile memory to have a threshold voltage, and a read current in a reading operation; and a comparator receiving a first input resulting from the read current and a second input in a form of one of a reference voltage and a reference current.

2. The circuit of claim 1 wherein the threshold voltage of the at least one bit in an erase state is larger than the threshold voltage of the at least one bit in a program state.

3. The circuit of claim 1 wherein the read current caused by the at least one bit in an erase state is lower than the read current caused by the at least one bit in a program state.

4. The circuit of claim 1, the first isolation layer and the second isolation layer further comprising silicon oxide.

5. The circuit of claim 1, the trapping layer further comprising nitride.

6. A system comprising:
a nonvolatile memory further comprising a p type semiconductor substrate, a first isolation layer over the p type semiconductor substrate, a trapping layer over the first isolation layer, a second isolation layer over the trapping layer, a gate over the second isolation layer; two N+ junctions in the p type semiconductor substrate, a source and a drain respectively formed on the N+ junctions;
the trapping layer being operable to retain electrons in an erase state for one of a drain bit and a source bit in the nonvolatile memory, causing the memory to have a threshold voltage, and a read current in a reading operation; and
a comparator receiving a first input resulting from the read current and a second input in a form of one of a reference voltage and a reference current.

7. The system of claim 6 wherein a bias voltage is applied to the source and the drain for reading the drain bit and the source bit, respectively.

8. The system of claim 6 wherein electric holes are injected at the drain and the source for programming the drain bit and the source bit, respectively.

9. The system of claim 6 wherein the threshold voltage of one of the drain bit and the source bit in an erase state is larger than the threshold voltage of one of the drain bit and the source bit in a program state.

10. The system of claim 6 wherein the read current caused by one of the drain bit and the source bit in an erase state is lower than the read current caused by one of the drain bit and the source bit in a program state.

11. A system having a nonvolatile memory comprising:
a semiconductor substrate further comprising a source, a drain, and a channel formed between the source and drain when the nonvolatile memory is read;
a first isolating layer over the channel;
a nonconducting trapping layer over the first isolating layer;
a second isolating layer over the nonconducting trapping layer;
a gate over the second isolating layer; and
a first bit and a second bit in the nonvolatile memory;
wherein the nonconducting trapping layer retains electrons in an erase state for the nonvolatile memory.

12. The system of claim 11 further comprising a first charge region and a second charge region wherein a net charge in the first and second charge regions is reduced in a programming state for the nonvolatile memory.

13. The system of claim 11, further comprising a tunnel layer over the channel.

14. The system of claim 13, the tunnel layer further comprising energy barriers for electrons and electric holes which are lower than those of the first isolating layer.

15. The system of claim 13, the tunnel layer further comprising at least one of titanium oxide and BST (barium, strontium and tantalum compound).

16. A method for operating a nonvolatile memory having at least one bit comprising:
erasing the at least one bit by retaining electrons in a trapping layer;
programming the at least one bit by injecting electric holes;
reading the at least one bit by applying a bias voltage;
detecting one of a threshold voltage and a read current for the at least one bit; and
providing one of a reference voltage and a reference current.

17. The method of claim 16 further comprising comparing the read current with the reference current wherein the at least one bit is erased if the read current is lower than the reference current.

18. The method of claim 16 further comprising comparing the read current with the reference current wherein the at least one bit is programmed if the read current is larger than the reference current.

19. The method of claim 16 further comprising forming a tunnel layer over the channel.

20. The method of claim 19 further comprising forming the tunnel layer wit at least one of titanium oxide and BST (barium, strontium and tantalum compound).

21. A method for operating a nonvolatile memory having a drain bit and a source bit comprising:
erasing one of the drain bit and the source bit by retaining electrons in a nitride layer in the nonvolatile memory;
programming the drain bit by injecting electric holes in a drain in the nonvolatile memory;
programming the source bit by injecting electric holes in a source in the nonvolatile memory; and
reading the drain bit and the source bit by applying a bias voltage to the source and the drain, respectively.

22. The method of claim 21 wherein the drain bit is programmed by electron reduction in the drain bit.

23. The method of claim 21 wherein the source bit is programmed by electron reduction in the source bit.

24. The method of claim 21 further comprising providing one of a reference voltage and a reference current.

25. The method of claim 24 wherein one of the reference voltage and the reference current is provided in a sensing circuit having a driver and a comparator.

26. The method of claim 24 further comprising: detecting a read current for the drain bit and the source bit, respectively; and comparing the read current with the reference current for the drain bit and the source bit, respectively.

27. The method of claim 26 wherein the drain bit is erased it at the drain, the read current is lower than the reference current.

28. The method of claim 26 wherein the source bit is erased if, at the source, the read current is lower than the reference current.

29. The method of claim 26 wherein the drain bit is programmed it at the drain, the read current is larger than the reference current.

30. The method of claim 26 wherein the source bit is programmed it at the source, the read current is larger than the reference current.

* * * * *